United States Patent [19]
Williamson

[11] Patent Number: 4,910,454
[45] Date of Patent: Mar. 20, 1990

[54] SYSTEM FOR ELECTRICAL SIGNAL SAMPLING WITH ULTRASHORT OPTICAL PULSES

[75] Inventor: Steven Williamson, Ann Arbor, Mich.

[73] Assignee: The University of Rochester, Rochester, N.Y.

[21] Appl. No.: 355,512

[22] Filed: May 23, 1989

[51] Int. Cl.$^4$ ............................................ G01R 23/16
[52] U.S. Cl. ................................. 324/77 K; 356/364; 350/356
[58] Field of Search .......................... 324/77 R, 77 K; 350/96.15, 96.16, 96.3, 96.32, 166, 360; 356/352

[56] References Cited

U.S. PATENT DOCUMENTS

| | | | |
|---|---|---|---|
| Re. 29,094 | 12/1976 | Price | 350/360 |
| 3,668,558 | 6/1972 | Hunsinger | 332/7.51 |
| 3,692,572 | 9/1972 | Strehlow | 117/201 |
| 4,196,396 | 4/1980 | Smith | 330/4.3 |
| 4,221,472 | 9/1980 | Smith et al. | 350/356 |
| 4,400,058 | 8/1983 | Durand | 350/166 |
| 4,616,898 | 10/1986 | Hicks | 350/96.15 |
| 4,618,819 | 10/1986 | Mourey et al. | 324/77 K |
| 4,681,449 | 7/1987 | Bloom et al. | 356/364 |

FOREIGN PATENT DOCUMENTS

3640340A1 5/1987 Fed. Rep. of Germany .

OTHER PUBLICATIONS

"Introduction to Modern Optics", 2nd edition by Grant R. Fowles, Holt, Reinhart and Winston, Inc.
V. N. Del Piano, A. F. Quesade, vol. 4, No. 11, Nov., 1965, pp. 1386–1390.
S. R. Blum, V. Del Piano, NEREM Record, 1964, pp. 68 & 69.

Primary Examiner—Michael J. Tokar
Attorney, Agent, or Firm—Martin Lukacher

[57] ABSTRACT

An electrical signal sampling system uses ultrashort optical pulses (of the order of 10 ps of less) to probe the electrical field from the signal being sampled. The probe is comprised of a modulator in the form of a Fabry-Perot optical interferometer (FP) incorporating a thin film of electro-optic material which may either be an index varying or piezo-electric material. This material, incorporated within the FP and subjected to an electric field, will cause a change in optical transmission characteristic by changing the optical path difference of the FP cavity. The bandwidth for the edge of the transmission window of the FP becomes much greater (by at least approximately 10 times) than the bandwidth of the optical pulses. The thickness or index of the electro-optic material is then adjusted so that the spectrum of the optical pulse falls on one edge (preferably at the 50% transmission point) of the transmission window. The electrical field then changes the optical path (the product of the refractive index and cavity thickness), by either changing the thickness or refractive index of the FP. The electro-optic material is preferably an electro-optic material that exhibits a strong pockels effect or a piezo-electric polymer oriented so that its rotational axis of symmetry (c-axis) is aligned with the E-vector of the electric field being sampled. The reflectivity of the FP, the thickness of the thin film which defines the FP cavity and the uniformity of the index is such that the finesse of the FP is high (suitably of the order of 10–100), and the sensitivity of the electro-optic modulator (the electro optic effect therein) is enhanced by an amount equal to the finesse.

10 Claims, 2 Drawing Sheets

SYSTEM FOR ELECTRICAL SIGNAL SAMPLING WITH ULTRASHORT OPTICAL PULSES

The present invention relates to electrical signal sampling systems that use ultrashort (of the order of 10 picoseconds (ps) or less) optical sampling pulses and particularly to a measurement system which uses as a probe a Fabry-Perot electo-optic interferometer modulator which is sensitive to electric fields and transduces such fields into intensity modulation of an optical beam so that when detected using a photo-responsive detector the signals are measureable with high temporal resolution and sensitivity.

Electrical signal sampling systems, as shown in U.S. Pat. Nos. 4,618,819 issued Oct. 21, 1986 and 4,681,449 issued July 21, 1987 and in U.S. patent application Ser. No. 709,751 filed Mar. 8, 1985, the counterpart of which appears in European Patent Application No. 0197196 published Oct. 15, 1986, may be improved by the use of the present invention in that electrical signals are sampled with enhanced sensitivity over the Pockels cell modulators or probes described therein.

The present invention utilizes a Fabry-Perot interferometer as a modulator. Such interferometers and their operation are known in the art and are described in the text, "Introduction to Modern Optics", Second Edition by Grant R. Fowles published by Holt, Reinhart and Winston, Inc. The principles of operation of such interferometers are discussed in Sections 4.1, 4.2 and 4.3 of the text. Fabry-Perot interferometers have also been suggested for use as modulators both with electro-optic birefringent crystals (See V. N. Del Piano and A. F. Quesada, Applied Optics, vol. 4, No. 11, November, 1965, pages 1386–1390) and utilizing Piezo-electric materials (See S. R. Blom and V. Del Piano, NEREM Record -1964, pages 68 and 69). The following patents also discuss Fabry-Perot interferometer arrangements for use as optical modulators: U.S. Pat. Nos. 3,668,558 issued June 6, 1972; 4,196,396 issued Apr. 1, 1980; and 4,221,472 issued Sept. 9, 1980 and German patent publication No. DE 364034A1 published May 27, 1987. Such Fabry-Perot interferometers utilize relatively thick layers of variable optical index of refraction or piezo-electric materials.

It has been found in accordance with the invention that ultrashort sampling pulses can be modulated effectively in a probe having a Fabry-Perot interferometer modulator with an ultra-thin layer of a field-induced variable index or piezo-electric material which defines the cavity of the Fabry-Perot interferometer. The field due to the electrical signal to be sampled extends through the cavity, preferably along the c-axis of an electro-optic field-dependent index material or the field extends through the piezo-electric material, which in the case of the piezo-electric material may be aligned by first poling the material with a DC electric field. The presence of an E-field increases or decreases (according to the sign or the E-field) the optical path, nd, of the FP cavity, where "n" is the refractive index and "d" is the cavity thickness. This causes a shift in the transmission window and, thus, modulates the probing optical beam.

Accordingly, it is the principal object of the present invention to provide an electrical signal sampling system using a Fabry-Perot (FP) modulator in which the electrical signal i electro-optically sampled by ultrashort (of the order of 10 ps or less) optical pulses thereby enhancing the sensitivity of the sampling system by the finesse of the FP. See Equation (4.9) of the above-referenced text by Fowles for a definition of finesse.

Briefly described, the invention improves on a system which electro-optically samples an electrical signal with ultrashort optical pulses by incorporating a Fabry-Perot modulator through which the optical pulses pass and are modulated in amplitude by the electrical signal. The modulator uses a thin layer of electro-optically sensitive material (either variable index or piezo-electric) and reflective layers, the reflective layers define the cavity of the Fabry-Perot interferometer in which the thin layer is located and through the width of which the optical pulses propagate. In other words, a beam of optical pulses passes through the Fabry-Perot interferometer cavity. The cavity layer is sufficiently thin to provide the modulator with a transmission characteristic having a bandwidth at full width, half-maximum (FWHM) of at least about 10 times that of the optical sampling pulses. Preferably the thin layer is equal to $\lambda/2$ in thickness, where $\lambda$ is the wavelength at the center of the spectrum of the optical pulses. Thus the bandwidth of the transmission curve is enlarged, while maintaining the enhancement of sensitivity of the modulator. The transmission curve has upper and lower band edges which increase and decrease between upper and lower limits. The Fabry-Perot is tuned either by adjusting the refractive index or the distance through which the pulses propagate so that the spectrum of the pulses fall on one of the edges between the upper and lower limits. The optical sampling pulse is effectively modulated in amplitude due to the small shift in the FP transmission curve. Such a shift changes the signal level detected by a photosensitive detector in the sampling system and correspond to the amplitude of the electric field under test, thereby providing an electrical signal which can be either measured or displayed.

The foregoing and other objects, features and advantages of the invention and presently preferred embodiments thereof will become more apparent from a reading of the following description in connection with the accompanying drawings in which.

Figure 1:
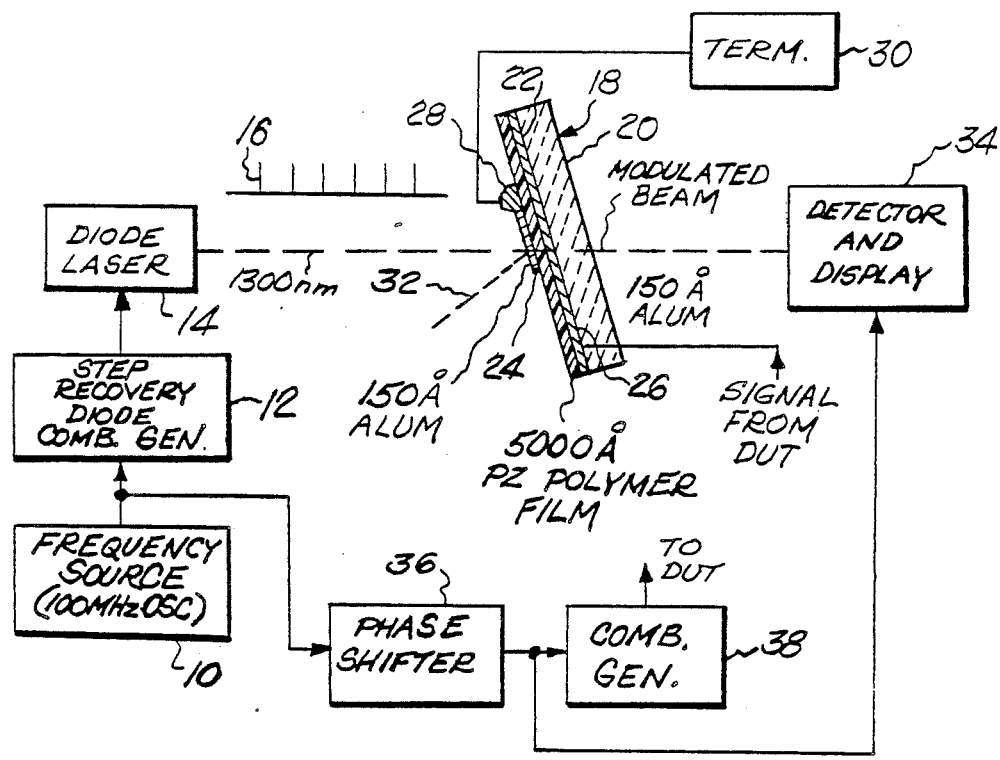
FIG. 1 is a diagram schematically illustrating an electric signal sampling system embodying the invention.

Referring to FIG. 1, there is shown an electrical signal sampling system of the type described generally in the above referenced U.S. Pat. No. 4,618,819. It utilizes a frequency source 10 which may be 100 MHz oscillator which drives a comb generator 12 which produced less than 100 ps electrical pulses. The comb generator is a step recovery diode. The comb of electrical pulses then drives a diode laser 14 which may produce a comb of successive optical pulses 16. The diode laser preferably operates in the near infrared at about 1300 nm (nanometers), but may operate at other wavelengths.

Figure 2:
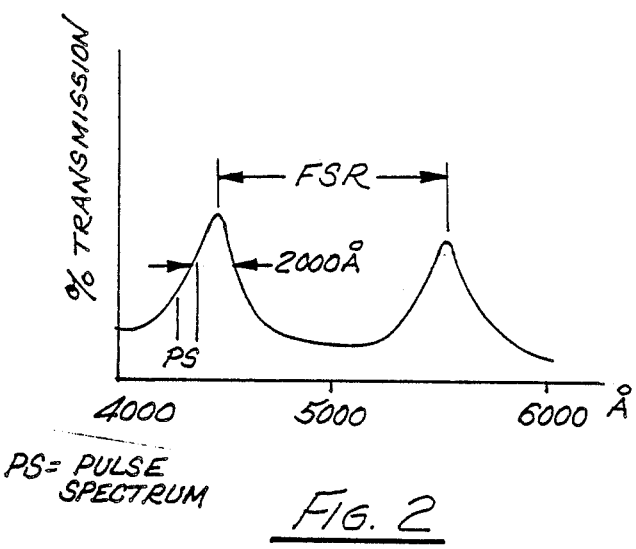
FIG. 2 is a plot of the transmission curve of the Fabry-Perot interferometer modulator of the system shown in FIG. 1.

The beam of sampling pulses propagates through a Fabry-Perot interferometer modulator 18 which is tilted with respect to the beam in order to tune the modulator so that the spectrum of the pulses (PS) lies at about the 50% point along a slope of the transmission curve of the modulator (see FIG. 2).

This transmission curve is illustrated in FIG. 2. This curve is characteristic of the class of Fabry-Perot modulators and is discussed in the above referenced text by G. R. Fowles. The curve has transmission regions which repeat at intervals known as the free spectral range (FSR). The first transmission peak of the repetitive intervals is utilized. This first peak corresponds to a cavity optical path equal to $\lambda/2$. The transmission curve (also called the characteristic) has lower and upper (in terms of the wavelength) sloping edges. This characteristic at FWHM has a bandwidth corresponding approximately 2,000 Å in wavelength, which is many times wider than the bandwidth of the spectrum of the ultra-short optical pulses. For example, a 1 ps, transform limited optical pulse has a bandwidth of approximately 10 Å.

This s less than 1% of the bandwidth for the FP. The wavelength window or transmission, $\Delta\lambda$, for an FP interferometer is given by the following expression:

$$\Delta\lambda = \frac{\text{Free Spectral Range (FSR)}}{\text{Finesse (F)}}$$

Where $FSR = \frac{\lambda^2}{2nd}$ and $F = \frac{\pi(R)^{\frac{1}{2}}}{(1-R)}$ Where:
$\lambda$ is wavelength
n is refractive index
d is mirror spacing
R is mirror reflectance $$\Delta\lambda = \frac{\lambda^2 (1-R)}{\pi n d}$$

For an FP of first order (i.e., of the interference filter-type):

$$nd = \tfrac{1}{2}\lambda$$

For one micron wavelength pulses and R of 90%

$\Delta\lambda = 6 \times 10^{-8} m = 600$Å
Bandwidth (in frequency)

$$\Delta\nu = \frac{C}{\lambda^2} \Delta\lambda$$

When C is the velocity of light, and for the example given above $\Delta\nu = 2 \times 10^{13}$ Hz which is the spectral window.

The transmission curve is obtained by the use of a thin film or layer of electro-optic material which may be a piezo-electric polymer film or a layer of gallium arsenide (GaAs). Any electro-optic material which may be deposited in very thin films may be used. At the present time only GaAs is able to be reliably grown in thin films of the requisite thickness in single crystal form. As other materials become available, such as CdS or CdSe, they may be used. GaAs is also slightly piezo-electric.

The FP is constructed of two reflective surfaces sandwiching the middle, E-O layer. The reflective coatings can be thin metallic films, 22 and 24, (i.e. 150Å of Al) or sophisticated dielectric stacks comprised of alternating high and low index layers of $\lambda/4$ thickness each. If the cavity layer is GaAs then such high/low GaAs layers can be epitaxially grown with exacting precision. The high/low layers can be n or p doped to permit charge build-up at the middle cavity layer. A high E-field is then obtained. Thin film deposition techniques of the type known in the art (see U.S. Pat. No. 3,692,572 of Sept. 19, 1972) may be used. Connections are made to the reflective layers, which provide electrodes, as shown at 26 and 28. The reflective lasers define the cavity of the Fabry-Perot interferometer. In the event the electro-optic crystalline material is used (such as GaAS) its c-axis or rotational axis of symmetry is generally perpendicular to the surfaces of the reflective layers 22 and 24 which define the cavity. Then an electrical signal from a device under test(DUT) which is applied across the conductive reflective layers 22 and 24 one of which is connected to the device under test and the other, for example, to a termination 30 such as ground or a terminating impedance). Then the electric field due to the signal which passes through the thin electro-optically active layer is aligned with the c-axis.

The index of the electro-optically active material may be varied by the addition of suitable dopants or the thickness may be adjusted by tilting the Fabry-Perot interferometer 18 as shown in FIG. 1 so as to tune the transmission characteristic and cause the spectrum of the optical pulses (PS as shown in FIG. 2) to fall on the slope of the transmission characteristic, preferably at approximately the 50% transmission point. It is also possible to tune the laser wavelength to arrive at the 50% transmission point. The modulation therefore will be responsive to both polarities of the electrical signal from the DUT.

A piezo-electric polymer film may be used as the electro-optically active layer. A piezo-electric polymer such as sold by Pennwalt Chemical Company of Philadelphia, Pennsylvania under the trade name Kynar may be used. The following is an example of how the piezo-electric polymer film may be fabricated. The polymer is dissolved in acetone and spin coated onto the substrate 20 after coating of the substrate with the reflective layer 22. This process is similar to that used for applying photoresist. After the opposite reflective and conductive film is applied, sandwiching the polymer, the piezo-electric polymer is polarized by applying a voltage across the conductive reflective films, for example, of E-field equal to 5-10 volts per micron.

The use of a very thin E-O film in the cavity of the modulator 18 has the additional advantage of allowing a high finesse which results in the narrow transmission characteristic and reducing the response time since the delay in the multiple reflections between the reflective layers 22 and 24 before the optical pulses exit the modulator is reduced. Backward reflections as indicated by the dotted line 32 may be absorbed by some absorbing material not shown. The finesse may also be defined by the ratio of the free spectral range to the bandwidth of the transmission characteristic at FWHM.

Returning to FIG. 1, the display or measurement of the signal from the DUT is provided in a manner similar to that in the above-referenced electrical signal sampling patents with a detector and display 34 which may be either streak camera but is preferably a photosensitive detector such as a PIN diode. The system (at the laser 14 output) has a polarizer at its front end that is aligned to the extraordinary axis (the axis sensitive to E-field) or the E-O crystal. This is only needed when the modulation action is caused by a change in refractive index. Variations in the index or thickness that change in response to the electrical signal can be directly detected as a change in amplitude or intensity of the light transmitted through the FP. Successive portions of the signal as sampled are viewed on the detector and display 34 by a phase shift technique using a phase shifter 36 which drives another comb generator 38. Variably delayed pulses are then applied to the device under test in order to obtain the electrical output signal from the DUT to the Fabry-Perot modulator 18, thereby characterizing the device under test.

Figure 3:
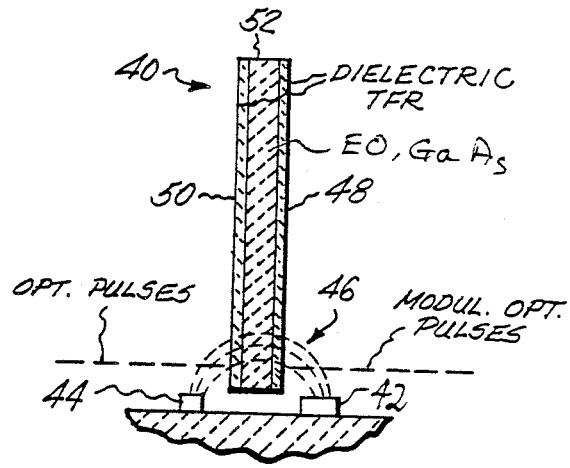
FIG. 3 is a sectional view in elevation of a Fabry-Perot interferometer probe which may be used in an electrical signal sampling system in accordance with the invention.

In order to provide a non-contacting sensor or probe, a Fabry-Perot interferometer modulator 40 as shown in FIG. 3 may be used. his probe is shown adjacent to conductors 42 and 44 carrying the signal under test. The signal under test produces a field shown at 46 which passes through the modulator 40. The modulator has dielectric thin film reflector layers which may be multilayer films of dielectric material 48 and 50. Such materials are desirably used a reflectors since they do not reflect the electric field 46. An electro-optically active material in the form of a thin film layer 52 is disposed between the reflective layers 48 and 50. The optical pulses propagate through the modulator 40 and modulated (with a transmission change in accordance with the field due to the signal on the conductors 42 and 44). These pulses are then displayed with a system such as shown in FIG. 1 or in the above-referenced patents on electrical signal sampling systems. The Fabry-Perot modulator 52 is very small indeed. It may be used to probe signals on microcircuits, such as integrated circuit chips.

From the foregoing description, it will be apparent that there has been provided an improved electrical signal sampling system which is operative with ultra short optical sampling pulses. Variations and modifications in the herein described system and in the Fabry-Perot modulators and probes thereof, all within the scope of the invention, will undoubtedly suggest themselves to those skilled in the art. The foregoing description, therefore, should be taken as illustrative and not in a limiting sense.

I claim:

1. In a system which measures an electrical signal with ultra-short optical pulses, the improvement which comprises a Fabry-Perot modulator through which said optical pulses pass and are modulated in amplitude by variation in transmission thereof in response to said electrical signal, said modulator comprising a thin layer of electro-optically sensitive material, reflective layers, said reflective layers defining a cavity in which said thin layer is located and through the width of which aid optical pulses propagate, said width being sufficiently thin to provide said modulator with a transmission characteristic having a bandwidth at FWHM of at least about 10 times the spectral bandwidth of said optical pulses, said characteristic having upper and lower band edges which increase and decrease between upper and lower limits, and means for tuning said modulator so that the spectrum of said pulses lies between said upper and lower limits along on of said band edges.

2. The improvement according to claim 1 wherein said layer of electro-optically sensitive material is a material which changes its index of refraction in response to said signal.

3. The improvement according to claim 1 wherein said thin layer of electro-optically sensitive material is piezo-electric such that said width changes in response to said signal.

4. The improvement according to claim 3 wherein said thin layer is a film of piezo-electric polymer.

5. The improvement according to claim 1 wherein said thin layer has a thickness of about $\lambda/2$ times the mean wavelength of said optical pulses.

6. The improvement according to claim 1 wherein said reflective layers are thin metallic layers, and connections for applying said electrical signal across said metallic layers.

7. The improvement according to claim 3 wherein said piezo-electric material has an axis polarization aligned generally perpendicular to said reflective layers of electro-optically sensitive material.

8. The improvement according to claim 2 wherein material is crystalline and has a c-axis of symmetry.

9. The improvement according to claim 9 wherein said c-axis is aligned generally with the field due to said electrical signal.

10. The improvement according to claim 9 wherein said material contains principally GaAS.

* * * * *